(12) United States Patent
Hu et al.

(10) Patent No.: US 11,955,635 B1
(45) Date of Patent: Apr. 9, 2024

(54) SINGLE CRYSTAL MULTI-ELEMENT POSITIVE ELECTRODE MATERIAL, PREPARATION METHOD THEREFOR, AND LITHIUM ION BATTERY

(71) Applicant: Beijing Easpring Material Technology Co., Ltd., Beijing (CN)

(72) Inventors: Yiseng Hu, Beijing (CN); Shanshan Li, Beijing (CN); Shunlin Song, Beijing (CN); Yafei Liu, Beijing (CN); Yanbin Chen, Beijing (CN)

(73) Assignee: Beijing Easpring Material Technology Co., Ltd., Beijing (CN)

( * ) Notice: Subject to any disclaimer, the term of this patent is extended or adjusted under 35 U.S.C. 154(b) by 0 days.

(21) Appl. No.: 18/497,404

(22) Filed: Oct. 30, 2023

Related U.S. Application Data

(63) Continuation of application No. PCT/CN2022/144086, filed on Dec. 30, 2022.

(30) Foreign Application Priority Data

Dec. 22, 2022 (CN) .......................... 202211659558.1

(51) Int. Cl.
*H01M 4/525* (2010.01)
*C30B 1/12* (2006.01)
(Continued)

(52) U.S. Cl.
CPC .............. *H01M 4/525* (2013.01); *C30B 1/12* (2013.01); *C30B 29/22* (2013.01);
(Continued)

(58) Field of Classification Search
None
See application file for complete search history.

(56) References Cited

U.S. PATENT DOCUMENTS

2021/0126242 A1 4/2021 Du et al.
2021/0143423 A1 5/2021 Paulsen et al.
(Continued)

FOREIGN PATENT DOCUMENTS

CN 108923041 A 11/2018
CN 110697787 A 1/2020
(Continued)

*Primary Examiner* — Carlos Barcena
(74) *Attorney, Agent, or Firm* — Volpe Koenig

(57) ABSTRACT

A single crystal multi-element positive electrode material and a preparation method therefor, and a lithium ion battery. The ratio of the length of the longest diagonal line to the length of the shortest diagonal line of the single crystal particles of the single crystal multi-element positive electrode material measured by an SEM is roundness R, and R≥1; and $D_{10}$, $D_{50}$ and $D_{90}$ of the single crystal particles of the single crystal multi-element positive electrode material satisfy: $K_{90}=(D_{90}-D_{10})/D_{50}$, and the product of $K_{90}$ and R is 1.20-1.40. The single crystal multi-element positive electrode material is more round and regular in morphology, the single crystal particles have uniform size, less agglomeration and less adhesion. The material has the characteristics of high compaction density, good rate capability and excellent cycle performance.

20 Claims, 3 Drawing Sheets

(51) Int. Cl.
*C30B 29/22* (2006.01)
*H01M 10/0525* (2010.01)
*H01M 4/02* (2006.01)

(52) U.S. Cl.
CPC .. *H01M 10/0525* (2013.01); *H01M 2004/021* (2013.01); *H01M 2004/028* (2013.01)

(56) References Cited

U.S. PATENT DOCUMENTS

| | | | |
|---|---|---|---|
| 2022/0285676 A1 | | 9/2022 | Kaneda et al. |
| 2023/0402595 A1* | | 12/2023 | Yubuchi ................ H01M 4/525 |

FOREIGN PATENT DOCUMENTS

| | | |
|---|---|---|
| CN | 112301428 A | 2/2021 |
| CN | 113036095 A | 6/2021 |
| CN | 113620352 A | 11/2021 |
| CN | 114703544 A | 7/2022 |
| CN | 114843502 A | 8/2022 |
| CN | 115084506 A | 9/2022 |
| CN | 115332530 A | 11/2022 |

* cited by examiner

SINGLE CRYSTAL MULTI-ELEMENT POSITIVE ELECTRODE MATERIAL, PREPARATION METHOD THEREFOR, AND LITHIUM ION BATTERY

CROSS REFERENCE TO RELATED APPLICATIONS

The present application claims the benefit of Chinese patent application 202211659558.1, filed on Dec. 22, 2022, the contents of which are incorporated herein by reference.

FIELD OF THE INVENTION

The present invention relates to the field of preparation of cathode materials, in particular to a single-crystal multi-element cathode material, a preparation method thereof and a lithium ion battery.

BACKGROUND OF THE INVENTION

The lithium ion battery has the outstanding advantages of high voltage, large energy density, good cycle performance, small self-discharge, no memory effect and the like. The cathode material is used as an important component part of the battery, and plays a decisive role in the capacity, performance and cost of the battery. The nickel-cobalt-manganese multi-element material is one of the most popular lithium battery cathode materials, and has higher gram capacity and good cycle stability. The multi-element cathode material is classified into an agglomerated type and a single crystal type according to the existence state of particles. Spherical particles of the agglomeration type multi-element cathode material are easy to break during rolling, and electrolyte can permeate into the agglomerated particles, so that a series of side effects are caused, and a great challenge is caused to a processing technology. The problems can be effectively avoided by designing the cathode material into a more stable single crystal structure.

The existing single crystal type cathode material is limited by conditions in the preparation process, particularly the influence of sintering atmosphere, the edge angle of single crystal particles is obvious, the roundness and regularity are poor, or the adhesion among the single crystal particles is serious, the independence is poor, and even the appearance of a precursor is still maintained. This is because the sintering is mostly performed in a single atmosphere (air or oxygen) in the prior art. Although the processing cost can be reduced by pure air sintering, the lithium salt is difficult to melt and permeate into the particles under the air condition, but covers the surfaces of the particles, and irregular primary particles are easily formed in the temperature-rising growth stage; in the constant-temperature fusion stage, lithium covered on the surfaces of the particles can fuse among the particles on the surfaces, so that the particles grow rapidly, the edges and corners of the sintered single crystal particles are obvious, the roundness and regularity are poor, irregular particles are easy to break in the rolling process of the pole pieces, or a diaphragm is pierced during assembly, so that the cycle performance of the battery is poor, and even the battery is subjected to water jumping. On the other hand, the pure oxygen sintering is adopted, so that the processing cost is increased, lithium salt is fused into the particles under the oxygen atmosphere, primary particles formed in the temperature rise stage are smooth and regular, but the particles are difficult to fuse in the constant-temperature stage, and therefore the particles are difficult to grow into single crystals or formed crystal particles are serious in adhesion and poor in independence, and even the shape of the precursor is still kept.

Therefore, the provision of the single crystal cathode material with round appearance, uniform size, less agglomeration and less adhesion and the preparation method thereof suitable for industrial production are very important.

SUMMARY OF THE INVENTION

The present invention aims to solve the problems of non-uniform grain size, easy adhesion among particles and poor roundness and regularity of single crystals of a single-crystal cathode material in the prior art.

In order to achieve the above object, the first aspect of the present invention provides a single-crystal multi-element cathode material, wherein the ratio of the length of the longest diagonal line to the length of the shortest diagonal line, which is measured by SEM, of the single crystal particles of the single-crystal multi-element cathode material is defined as roundness R, and R≥1; $D_{10}$, $D_{50}$ and $D_{90}$ of the single crystal particles of the single-crystal multi-element cathode material satisfy: $K_{90}=(D_{90}-D_{10})/D_{50}$, and the product of $K_{90}$ and R is 1.20-1.40.

The second aspect of the present invention provides a method for preparing a single-crystal multi-element cathode material, comprising the following steps:
(1) Performing first sintering on a mixture containing a nickel-cobalt-manganese precursor and a lithium source, and crushing an obtained product to obtain a single-crystal cathode material process product;
(2) Performing second sintering on the single-crystal cathode material process product to obtain a single-crystal multi-element cathode material;
The first sintering comprises a temperature rise stage I and a constant temperature stage I which are sequentially carried out, wherein the temperature rise stage I is carried out in an oxygen atmosphere, and the constant temperature stage I is carried out in an air atmosphere;
The temperature of the second sintering is not higher than that of the first sintering.

The third aspect of the present invention provides a single-crystal multi-element cathode material prepared by the method of the second aspect.

The fourth aspect of the present invention provides a lithium ion battery, which contains the single-crystal multi-element cathode material of the first aspect or the third aspect.

According to the technical scheme, the method provided by the present invention is based on the aspect of optimizing the sintering process, the temperature rising section adopts an oxygen atmosphere in the first sintering process, the constant temperature section adopts an air atmosphere to optimize the appearance of the single crystal, the single-crystal multi-element cathode material obtained by combining the second sintering process meets the specific roundness and uniformity, the appearance of the single crystal particles is more round and regular, the size is uniform, the aggregation is less, the adhesion is less, the compaction density in the electrode manufacturing process can be higher, and the fragmentation and the falling are not easy to occur in the processing and battery circulating processes, so that the energy density, the rate capability and the circulating stability of the battery are improved.

In addition, the single-crystal cathode material has better performance in the aspects of cycle life, rate capability, stability, safety and processability than the non-single-crystal cathode material.

DETAILED DESCRIPTION OF THE EMBODIMENTS

Figure 1:
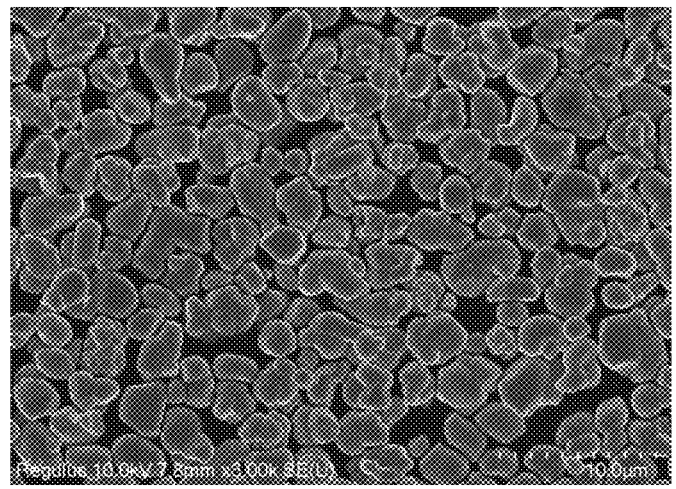
FIG. 1 is an SEM image of a single-crystal multi-element cathode material prepared in example 1 of the present invention.

The endpoints and any values of the ranges disclosed herein are not limited to the precise range or value, and these ranges or values should be understood as including values close to these ranges or values. For numerical ranges, the endpoint values of each range, the endpoint values of each range and individual point values, and individual point values may be combined with each other to obtain one or more new numerical ranges, and these numerical ranges should be considered to be specifically disclosed herein.

In the present invention, unless explicitly stated otherwise, neither "first" nor "second" represent a sequential order nor do they limit the respective materials or operations, but merely distinguish the respective materials or operations, for example, "first" and "second" in "first sintering" and "second sintering" are merely distinguished to mean that they are not the same sintering operation.

The room temperature in the present invention means 25±2° C. unless otherwise specified.

The first aspect of the present invention provides a single-crystal multi-element cathode material, wherein the ratio of the length of the longest diagonal line to the length of the shortest diagonal line, which is measured by SEM, of the single crystal particles of the single-crystal multi-element cathode material is defined as roundness R, and R≥1; $D_{10}$, $D_{50}$ and $D_{90}$ of the single crystal particles of the single-crystal multi-element cathode material satisfy: $K_{90}=(D_{90}-D_{10})/D_{50}$, and the product of $K_{90}$ and R is 1.20-1.40.

For the single-crystal cathode material, the quality of the single crystal structure directly influences the electrochemical performance of the cathode material, and the inventor of the present invention finds that the single-crystal multi-element cathode material meeting the specific parameter limitation has round and regular appearance, uniform particle size, less aggregation and less adhesion, can ensure that the cathode material has higher compaction density in the process of manufacturing an electrode, and is not easy to crack and fall off in the processes of processing and battery circulation, thereby being beneficial to improving the energy density and the circulation stability of the battery.

According to some embodiments of the present invention, the ratio of the length of the longest diagonal line to the length of the shortest diagonal line, which is measured by SEM, of the single crystal particles of the single-crystal multi-element cathode material is defined as roundness R, and R≥1, and the closer the R value is to 1, the closer the lengths of the longest diagonal line and the shortest diagonal line of the single-crystal particle are, indicating that the shape of the material is more rounded and regular. The round and regular single crystal particles are favorable for preventing the cathode material from being cracked in the pole piece rolling process, preventing the irregular corners of the cathode material from piercing the diaphragm when the battery is assembled, and improving the safety performance and the cycle performance of the battery. In the present invention, R is a statistical result obtained by randomly selecting 300 single crystal particles as a sample in an SEM image.

According to some embodiments of the present invention, preferably, R is 1-1.2. The single crystal particles of the single-crystal multi-element cathode material adopting the preferred embodiment have more round and regular shapes, and are beneficial to further improving the safety performance and the cycle performance of the battery.

According to some embodiments of the present invention, the single crystal particles of the single-crystal multi-element cathode material obtained by the particle size test have a particle size $D_{10}$ corresponding to 10% of volume distribution, a particle size $D_{50}$ corresponding to 50% of volume distribution, and a particle size $D_{90}$ corresponding to 90% of volume distribution, and the uniformity of the single-crystal multi-element cathode material is defined as $K_{90}$, and $K_{90}=(D_{90}-D_{10})/D_{50}$, a product of $K_{90}$ and R is 1.20-1.40.

According to some embodiments of the present invention, the product of $K_{90}$ and R is preferably 1.25-1.35. The single-crystal multi-element cathode material adopting the preferred embodiment has higher capacity and cycle retention rate, and is beneficial to further improving the compaction density of the cathode material.

According to some embodiments of the present invention, preferably, the single-crystal multi-element cathode material has a particle size $D_{10}$ of 1.5-2.5 μm.

According to some embodiments of the present invention, preferably, the single-crystal multi-element cathode material has a particle size $D_{50}$ of 3-5 μm.

According to some embodiments of the present invention, preferably, the single-crystal multi-element cathode material has a particle size $D_{90}$ of 6-8 μm.

In the present invention, the particle size test is performed using a laser particle size analyzer model Hydro 2000mu from Marvern.

According to some embodiments of the present invention, the smaller the value of K90, the better the uniformity of the single crystal particles; the greater the value of $K_{90}$, the worse the uniformity of the single crystal particles. Preferably $K_{90}$ is 1.18 to 1.25, preferably 1.20 to 1.22. The single-crystal multi-element cathode material adopting the preferred embodiment has better uniformity of single crystal particles, is beneficial to increasing gradation and improving the compaction density of the material.

According to some embodiments of the present invention, preferably, the single-crystal multi-element cathode material has a structure represented by formula I:

formula I;

In the formula, −0.05≤a≤0.3, 0≤b≤0.05, 0≤c≤0.05, 0.5≤x≤1, 0<y<0.5, 0<z<0.5; d is valued to ensure that the positive and negative charges are equal; G is one or more of Ti, W, V, Ta, Zr, La, Ce, Er, Sr, Si, Al, B, Mg, Co, F and Y; M is one or more of Sr, F, B, Al, Nb, Co, Mn, Mo, W, Si, Mg, Ti and Zr;

More preferably, in the formula, 0≤a≤0.2, 0.0001≤b≤0.005, 0.0001≤c≤0.005, 0.5≤x≤0.95, 0.01≤y≤0.4, 0.01≤z≤0.4.

More preferably, in the formula, G is one or more of Ti, W, Zr, Sr, Si, Al, B and F; and/or M is one or more of Sr, F, B, Al, W, Si and Ti.

By adopting the preferred embodiment, the energy density, rate capability and cycling stability of the battery can be further improved.

According to some embodiments of the present invention, in formula I, if G and M are both cationic, d=0; if G and M are both anionic, d=b+c; if G is an anion and M is a cation, then d=b; if M is an anion and G is a cation, d=c.

According to some embodiments of the present invention, preferably, the agglomeration rate of the single-crystal multi-element cathode material is defined as B, and the number of single crystal particles having an agglomerated morphology in any 300 single crystal particles of the single-crystal multi-element cathode material measured by SEM is n, wherein B=n/300*100%, and B is 0 to 3.0%, preferably 0.8% to 2.4%. The larger the agglomeration rate B, the lower the degree of single crystallization of the cathode material, and conversely, the higher the degree of single crystallization. The cathode material particles that stick together tend to fall off or break during high voltage or long cycling of the battery, resulting in failure of the battery. In general, the smaller the value of the agglomeration rate B, the better the cycle performance. The single-crystal multi-element cathode material adopting the preferred embodiment has the advantages of small agglomeration rate of single crystal particles, high single crystallization degree, less adhesion, and difficult shedding or fragmentation under high voltage or in a long cycle process, and is favorable for further improving the energy density, rate capability and cycle stability of the battery.

According to some embodiments of the present invention, it is preferable to define an average value of a length of a longest diagonal line and a length of a shortest diagonal line of any 300 single crystal particles of the single-crystal multi-element cathode material measured by SEM as a crystal grain size $P_{50}$, and $P_{50}$ is 1.5 μm to 3.0 μm, preferably 2.0 μm to 2.4 μm. If the value of $P_{50}$ is too large, the transmission distance of lithium ions in the cathode material will be increased, which affects the performance of capacity; if the value of $P_{50}$ is too small, it will cause material agglomeration, or even failure to form a single crystal material, which can affect the cycle performance of the material. The single-crystal multi-element cathode material of the preferred embodiment is beneficial to further improving the capacity and the cycle performance of the single-crystal multi-element cathode material.

According to the present invention, the single-crystal multi-element cathode material adopts a secondary sintering process in the preparation process, in the first sintering process, the temperature rising section adopts an oxygen atmosphere, and the constant temperature section adopts an air atmosphere, so that the single crystal particles are more round and regular in appearance, more uniform in size, less in agglomeration and adhesion, higher in compaction density, and beneficial to improvement of the energy density, rate capability and circulation stability of the battery.

The second aspect of the present invention provides a method for preparing a single-crystal multi-element cathode material, comprising the following steps:

(1) Performing first sintering on a mixture containing a nickel-cobalt-manganese precursor and a lithium source, and crushing an obtained product to obtain a single-crystal cathode material process product;

(2) Performing second sintering on the single-crystal cathode material process product to obtain a single-crystal multi-element cathode material;

The first sintering comprises a temperature rise stage I and a constant temperature stage I which are sequentially carried out, wherein the temperature rise stage I is carried out in an oxygen atmosphere, and the constant temperature stage I is carried out in an air atmosphere;

The temperature of the second sintering is not higher than that of the first sintering.

Most of the existing methods for preparing single crystal cathode materials adopt single atmosphere (air or oxygen) for sintering, so that the edges and corners of single crystal particles are obvious, the roundness and regularity are poor, or the adhesion among the single crystal particles is serious, the independence is poor, and the appearance of a precursor is still maintained. The inventor of the present invention finds that the solid phase reaction of the mixture of the nickel-cobalt-manganese precursor and the lithium source is divided into two stages of growth and fusion, wherein the growth stage is a temperature rise stage with lower temperature, namely the lithium source is fused and permeated into the particles of the precursor, and a primary reaction is carried out to ensure that the fibers forming the precursor grow to be full and grow to be fine primary particles; the fusion stage is a constant temperature stage with higher temperature, namely the lithium source further reacts with the fine primary particles to fuse the fine primary particles into large particles. The method is characterized in that an oxygen atmosphere is adopted in a temperature rise nucleation stage (the temperature rise stage I of the first sintering) of the reaction of a nickel-cobalt-manganese precursor and a lithium source, primary particles formed by fibers are full and round, an air atmosphere is adopted in a constant temperature sintering growth stage (the constant temperature stage I of the first sintering), single crystal particles are fused into large single crystal particles more easily, finished product particles of the cathode material are further round and regular through secondary sintering (the second sintering), the obtained single-crystal multi-element cathode material is round and regular in appearance, uniform in particle size, less in agglomeration and adhesion, and has the characteristics of high compaction density, good rate capability and excellent cycle performance.

According to some embodiments of the present invention, in step (1), the nickel-cobalt-manganese precursor may be a nickel-cobalt-manganese precursor suitable for preparing a cathode material, which is well known in the art, and is not particularly limited, and all of which can achieve the object of the present invention to some extent. Preferably, the nickel-cobalt-manganese precursor is selected from oxides and/or hydroxides comprising nickel, cobalt and manganese.

According to some embodiments of the present invention, in step (1), the lithium source may be any lithium source known in the art to be suitable for preparing a cathode material, and is not particularly limited thereto, and can achieve the object of the present invention to some extent. Preferably, the lithium source is selected from lithium carbonate and/or lithium hydroxide.

According to some embodiments of the present invention, preferably, in step (1), the amount of the lithium source satisfies, in terms of a stoichiometric ratio: $1.02 \leq [n(Li)]/[n(Ni)+n(Co)+n(Mn)] \leq 1.06$.

According to some embodiments of the present invention, preferably, in step (1), the mixed raw material further includes an additive agent selected from a compound containing G, preferably at least one of an oxide, a hydroxide, a carbonate, and a fluoride containing G, and more preferably at least one of zirconia, strontium carbonate, strontium hydroxide, silica, alumina, aluminum hydroxide, tungsten trioxide, titanium oxide, aluminum fluoride, and boron oxide. Wherein, G can be selected as described above, and is not described herein again. In the present invention, the additive agent is beneficial to the formation of single crystallization of the material, reduces the internal resistance and improves the cycling stability of the material.

According to some embodiments of the present invention, preferably, in step (1), the amount of the additive agent in terms of G element satisfies, in terms of stoichiometric ratio: $0.0001 \leq [n(G)]/[n(Ni)+n(Co)+n(Mn)] \leq 0.005$.

According to some embodiments of the present invention, in step (1), the temperature rise stage I is performed under an oxygen atmosphere, and by using an oxygen atmosphere in the temperature rise nucleation stage (i.e. the temperature rise stage I of the first sintering) of the reaction of the nickel-cobalt-manganese precursor and the lithium source, the primary particles formed by the fibers can be more full and round.

According to some embodiments of the present invention, preferably, in step (1), the condition of the temperature rise stage I further includes: the temperature rise time is 2-10 h, preferably 6-8 h. And in the temperature rise stage I, the temperature is raised to the constant temperature in the constant temperature stage I through the temperature rise time.

According to some embodiments of the present invention, in step (1), the constant temperature stage I is performed under an air atmosphere, and by using an air atmosphere in the growth stage of the constant temperature sintering (the constant temperature stage I of the first sintering), the single crystal particles can be more easily fused to form large single crystal particles.

According to some embodiments of the present invention, preferably, in step (1), the conditions of the constant temperature stage I further include: the constant temperature is 600-1100° C., and preferably 900-1000° C.; the constant temperature time is 6-12 h, preferably 8-10 h.

According to some embodiments of the present invention, preferably, in step (1), the median particle size $D_{50}$ of the nickel-cobalt-manganese precursor is 3-5 μm.

According to some embodiments of the present invention, preferably, in step (1), the median particle size $D'_{50}$ of the single-crystal cathode material processed product is 3-5 μm.

According to some embodiments of the present invention, preferably, in step (1), the median particle size $D_{50}$ of the nickel-cobalt-manganese precursor and the median particle size $D'_{50}$ of the single-crystal cathode material process product satisfy formula II:

$$|(D_{50}-D'_{50})/D_{50}| < 5\% \quad \text{formula II.}$$

The adoption of the preferred embodiment is beneficial to obtaining the single-crystal multi-element cathode material with the granularity $D_{10}$, $D_{50}$, $D_{90}$ and the uniformity $K_{90}$ meeting the above requirements.

According to some embodiments of the present invention, in step (1), the first sintering is combined with the crushing treatment, so that the median particle size $D'_{50}$ of the obtained single-crystal cathode material process product meets the above requirement. The equipment used for the crushing treatment is not particularly limited as long as a single-crystal cathode material process product having a median particle size $D'_{50}$ satisfying the above requirements can be obtained, and preferably, the equipment used for the crushing treatment is selected from at least one of a soybean milk machine, a jaw crusher, a double roll mill, a colloid mill, a mechanical mill and an air flow mill.

According to some embodiments of the present invention, preferably, in the step (2), the single-crystal cathode material process product is mixed with a coating agent, and the resultant mixture is subjected to the second sintering; the coating agent is selected from a compound containing M, preferably at least one of an oxide, a hydroxide, a carbonate and a fluoride containing M, and more preferably at least one of strontium carbonate, strontium hydroxide, silica, alumina, aluminum hydroxide, tungsten trioxide, titanium oxide, aluminum fluoride and boron oxide. Wherein, M can be selected as described above, and is not described herein again. According to the present invention, the coating agent is beneficial to reducing free lithium and improving the cycling stability of the material in a high-temperature and high-voltage environment.

According to some embodiments of the present invention, preferably, in step (2), the amount of the coating agent in terms of M element satisfies, in terms of a stoichiometric ratio: $0.0001 \leq [n(M)]/[n(Ni)+n(Co)+n(Mn)] \leq 0.005$.

According to some embodiments of the present invention, the nickel cobalt manganese precursor, the lithium source, the additive agent, and the coating agent are used in amounts such that, in the resulting single-crystal multi-element cathode material, n(Li): n(Ni): n(Co): n(Mn): n(G): n(M)=(1+a): x: y: z: b: c, wherein the values of a, b, c, x, y and z can be defined and selected by referring to the above, and are not described in detail herein.

According to some embodiments of the present invention, preferably, in the step (2), the second sintering is performed under an air atmosphere.

According to some embodiments of the present invention, preferably, in step (2), the second sintering includes a temperature rise stage II and a constant temperature stage II which are sequentially performed.

According to some embodiments of the present invention, preferably, in step (2), the conditions of the temperature rise stage II further include: the temperature rise time is 2-10 h, preferably 4-7 h.

According to some embodiments of the present invention, preferably, in step (2), the conditions of the constant temperature stage II further include: the constant temperature is 500-900° C., and preferably 600-800° C.; the constant temperature time is 6-12 h, preferably 8-10 h.

According to some embodiments of the present invention, preferably, ΔP is the grain size change value of the single-crystal multi-element cathode material, in units of μm; ΔT is the temperature change value in the same sintering step, in units of ° C.; Δt is the time change value in the same sintering step, in units of h, and the three satisfy: $\Delta P = \omega \Delta T + \gamma \Delta t$, wherein $\omega = 0.02$ μm/° C., $\gamma = 0.1$ μm/h. For example, when the constant temperature of the constant temperature stage I of the first sintering is $T_1$° C. and the constant temperature time is $t_1$ h, the grain size $P_{50}$ of the obtained single-crystal multi-element cathode material is $P_1$ μm; when the constant temperature of the first constant temperature stage I is $T_2°$ C. and the constant temperature time is $t_2$ h, the grain size $P_{50}$ of the obtained single-crystal multi-element cathode material is $P_2$ μm, then $\Delta T$ is the absolute value of the difference between $T_1$ and $T_2$ (i.e. $|T_1-T_2|°$ C.), $\Delta t$ is the absolute value of the difference between $t_1$ and $t_2$ (i.e. $|t_1-t_2|$ h), $\Delta P$ is the absolute value of the difference between $P_1$ and $P_2$ (i.e. $|P_1-P_2|$ μm), and $\Delta P=\omega\Delta T+\gamma\Delta t$.

The third aspect of the present invention provides a single-crystal multi-element cathode material prepared by the method of the second aspect.

According to some embodiments of the present invention, the single-crystal multi-element cathode material is the same as or similar to the single-crystal multi-element cathode material of the first aspect of the present invention, and is not repeated herein.

The fourth aspect of the present invention provides a lithium ion battery, which contains the single-crystal multi-element cathode material of the first aspect or the third aspect.

The present invention will be described in detail below by way of examples.

In the following examples and comparative examples, all the raw materials used are commercially available unless otherwise specified.

In the following examples and comparative examples, relevant parameters were measured by the following methods:
(1) Morphology testing: the test result is obtained by testing with a scanning electron microscope test of S-4800 model of Japanese Hitachi company, wherein the roundness R, the agglomeration rate B and the crystal grain size $P_{50}$ are obtained by an SEM image test;
(2) Particle size $D_{10}$, $D_{50}$, $D_{90}$: the test result is obtained by testing with a laser particle size analyzer of Hydro 2000mu model of Marvern company;
(3) Compacting density: the test result is obtained by a tap density tester of BT-30 model of Baite company;
(4) Electrochemical performance testing:
In the following examples and comparative examples, electrochemical performance of single-crystal multi-element cathode materials was tested using CR2032 button cells.

The preparation process of the CR2032 button cell is as follows:
Preparing a pole piece: mixing a single-crystal multi-element cathode material, conductive carbon black and polyvinylidene fluoride (PVDF) according to a ratio of 95:2:3 and a proper amount of N-methylpyrrolidone (NMP) are fully mixed to form uniform slurry, the slurry is coated on an aluminum foil and dried at 120° C. for 12 hours, and then the aluminum foil is subjected to punch forming by using the pressure of 100 MPa to prepare the positive pole piece with the diameter of 15.8 mm and the thickness of 3.2 mm, wherein the loading capacity of the single-crystal multi-element cathode material is 15.5 mg/cm$^2$.

Assembling the battery: in an argon-filled gas glove box with water content and oxygen content less than 5 ppm, a CR2032 button cell is assembled by a positive pole piece, a separator, a negative pole piece and electrolyte and then kept stand for 6 hours. Wherein, the negative pole piece uses a metal lithium piece with the diameter of 15.8 mm and the thickness of 1 mm; the separator used a polypropylene microporous membrane (Celgard 2325) having a thickness of 25 μm; an equal mixed solution of 1 mol/L LiPF$_6$, ethylene carbonate (EC) and diethyl carbonate (DEC) was used as the electrolyte.

Electrochemical Performance Testing

In the following examples and comparative examples, the electrochemical performance of the CR2032 button cell was tested by using the Shenzhen new Willer cell test system, and the charge and discharge current density at 0.1C was 100 mA/g.

Controlling the charging and discharging voltage interval to be 3.0-4.4V, respectively carrying out charging and discharging tests on the button cell at 0.1C and 0.3C at room temperature, and evaluating the charging and discharging specific capacity of the single-crystal multi-element cathode material.

High-temperature cycle performance test: controlling the charging and discharging voltage interval to be 3.0-4.4V, and at the constant temperature of 60° C., carrying out charging and discharging circulation on the button cell for 2 times at 0.1C, and then carrying out charging and discharging circulation for 80 times at 1C to evaluate the high-temperature circulation capacity retention rate of the single-crystal multi-element cathode material.

Rate performance test: controlling the charging and discharging voltage interval to be 3.0-4.4V, and at room temperature, carrying out charging and discharging circulation on the button cell at 0.1C for 2 times, and then carrying out charging and discharging circulation on the button cell at 0.3C for 1 time, and evaluating the rate performance of the multi-element cathode material by the ratio of the first discharging specific capacity of 0.1C to the first discharging specific capacity of 0.3C.

Example 1

(1) Performing first sintering on a mixture containing a nickel-cobalt-manganese precursor, a lithium source and an additive agent, and crushing an obtained product to obtain a single-crystal cathode material process product; wherein:
The nickel-cobalt-manganese precursor is a hydroxide containing nickel, cobalt and manganese, and the chemical formula of the nickel-cobalt-manganese precursor is shown in table 2; the types of lithium source and additive agents and the amounts of each raw material used are shown in table 1; the equipment used for crushing treatment is soybean milk machine;
The first sintering is a temperature rise stage I and a constant temperature stage I which are sequentially carried out, and the specific conditions are shown in a table 1;
The median particle size $D_{50}$ of the nickel-cobalt-manganese precursor and the median particle size $D'_{50}$ of the single-crystal cathode material process product are shown in Table 1;
(2) Performing second sintering on the single-crystal cathode material process product to obtain a single-crystal multi-element cathode material; wherein:
The second sintering is carried out in an air atmosphere; the second sintering is a temperature rise stage II and a constant temperature stage II which are sequentially carried out, and the specific conditions are shown in table 1; the chemical formula of each product during the reaction is shown in Table 2.

Example 2

The method of example 1 was followed except that: in step (1), the constant temperature in the constant temperature stage I of the first sintering and the median particle size value $D'_{50}$ of the single-crystal cathode material process product, which were shown in Table 1, and the rest were the same, resulting in a single-crystal multi-element cathode material.

Example 3

The method of example 1 was followed except that: in step (1), the constant temperature in the constant temperature stage I of the first sintering and the median particle size value $D'_{50}$ of the single-crystal cathode material process product, which were shown in Table 1, and the rest were the same, resulting in a single-crystal multi-element cathode material.

The other examples followed the method of example 1, with the differences shown in Table 1, and the rest were the same, and single-crystal multi-element cathode materials were obtained.

Comparative Example 1

The method of example 1 was followed except that in step (1), the first sintering was performed in an air atmosphere and the rest were the same, to obtain a single-crystal multi-element cathode material.

Comparative Example 2

The method of example 1 was followed except that in step (1), the first sintering was carried out in an oxygen atmosphere and the rest were the same, to obtain a single-crystal multi-element cathode material Comparative Example 3

The method of example 2 was followed except that in step (1), the first sintering was performed in an air atmosphere and the rest were the same, to obtain a single-crystal multi-element cathode material.

Comparative Example 4

The method of example 3 was followed except that in step (1), the first sintering was performed in an oxygen atmosphere and the rest were the same, to obtain a single-crystal multi-element cathode material.

Comparative Example 5

The method of example 3 was followed except that in step (1), $D'_{50}$ of the obtained single-crystal cathode material process product was 3.64 μm, $|(D_{50}-D'_{50})/D_{50}|=13.3\%$, and the rest were the same, the single-crystal multi-element cathode material was obtained, and the uniformity $K_{90}$ thereof was shown in Table 3.

Comparative Example 6

The method of example 3 was followed except that, in step (1), $D'_{50}$ of the obtained single-crystal cathode material processed product was 4.49 μm, $|(D_{50}-D'_{50})/D_{50}|=6.9\%$, and the rest were the same, the single-crystal multi-element cathode material was obtained, and the uniformity $K_{90}$ thereof was shown in Table 3.

TABLE 1

| Items | | Example 1 | Example 2 | Example 3 | Example 4 | Example 5 |
|---|---|---|---|---|---|---|
| Ni—Co—Mn precursor/Ni:Co:Mn | | 55:15:30 | 55:15:30 | 55:15:30 | 80:10:10 | 92:3:5 |
| Lithium source | | Lithium carbonate | Lithium carbonate | Lithium carbonate | Lithium hydroxide | Lithium hydroxide |
| Additive agent | | $ZrO_2$ | $ZrO_2$ | $ZrO_2$ | $Sr(OH)_3$ | $ZrO_2$, $SiO_2$ |
| The amount [1]/mol ratio | | 1:1.04:0.002 | 1:1.04:0.002 | 1:1.04:0.002 | 1:1.03:0.001 | 1:1.03:0.002:0.0005 |
| First sintering | | | | | | |
| Temperature rise stage I | Sintering atmosphere | Oxygen gas | Oxygen gas | Oxygen gas | Oxygen gas | Oxygen gas |
| | Time/h | 6 | 6 | 6 | 6 | 6 |
| Constant temperature stage I | Sintering atmosphere | Air | Air | Air | Air | Air |
| | Temperature/°C. | 950 | 930 | 970 | 930 | 890 |
| | Time/h | 10 | 10 | 10 | 10 | 10 |
| $D_{50}$ of Nickel cobalt manganese precursor/μm | | 4.20 | 4.20 | 4.20 | 3.85 | 3.60 |
| $D'_{50}$ of single-crystal cathode material process product/μm | | 4.33 | 4.24 | 4.12 | 3.93 | 3.46 |
| $|(D_{50}-D'_{50})/D_{50}|$ unit% | | 3 | 1 | 2 | 2 | 4 |
| Coating agent | | $Al_2O_3$ | $Al_2O_3$ | $Al_2O_3$ | $B_2O_3$ | $B_2O_3$, $WO_3$ |
| The amount [2]/mol ratio | | 1:0.0015 | 1:0.0015 | 1:0.0015 | 1:0.001 | 1:0.0005:0.002 |
| Second sintering | | | | | | |
| Temperature rise stage II | Sintering atmosphere | Air | Air | Air | Air | Air |
| | Time/h | 5 | 5 | 5 | 5 | 5 |
| Constant temperature stage II | Sintering atmosphere | Air | Air | Air | Air | Air |
| | Temperature/°C. | 650 | 650 | 650 | 650 | 650 |
| | Time/h | 8 | 8 | 8 | 8 | 8 |

Note: the amount [1] is the total molar weight of nickel, cobalt and manganese elements in the nickel-cobalt-manganese precursor: the molar amount of lithium element in lithium source: the molar amount of the G element in the additive agent;

The amount [2] is the total molar weight of nickel, cobalt and manganese elements in the nickel-cobalt-manganese precursor: the molar amount of the M element in the coating agent.

TABLE 2

| Number | Ni—Co—Mn precursor | Single-crystal cathode material process product | Single-crystal multi-element cathode material |
|---|---|---|---|
| Example 1 | $Ni_{0.55}Co_{0.15}Mn_{0.30}(OH)_2$ | $Li(Ni_{0.5489}Co_{0.1497}Mn_{0.2994}Zr_{0.0020})O_2$ | $Li(Ni_{0.5481}Co_{0.1495}Mn_{0.2990}Zr_{0.0020})Al_{0.0015}O_2$ |
| Example 2 | $Ni_{0.55}Co_{0.15}Mn_{0.30}(OH)_2$ | $Li(Ni_{0.5489}Co_{0.1497}Mn_{0.2994}Zr_{0.0020})O_2$ | $Li(Ni_{0.5481}Co_{0.1495}Mn_{0.2990}Zr_{0.0020})Al_{0.0015}O_2$ |
| Example 3 | $Ni_{0.55}Co_{0.15}Mn_{0.30}(OH)_2$ | $Li(Ni_{0.5489}Co_{0.1497}Mn_{0.2994}Zr_{0.0020})O_2$ | $Li(Ni_{0.5481}Co_{0.1495}Mn_{0.2990}Zr_{0.0020})Al_{0.0015}O_2$ |
| Example 4 | $Ni_{0.80}Co_{0.10}Mn_{0.10}(OH)_2$ | $Li(Ni_{0.7992}Co_{0.0999}Mn_{0.0999}Sr_{0.0010})O_2$ | $Li(Ni_{0.7984}Co_{0.0998}Mn_{0.0998}Sr_{0.0010})B_{0.0010}O_2$ |
| Example 5 | $Ni_{0.92}Co_{0.03}Mn_{0.05}(OH)_2$ | $Li(Ni_{0.9182}Co_{0.0299}Mn_{0.0499}Zr_{0.0020}Si_{0.0005})O_2$ | $Li(Ni_{0.9154}Co_{0.0299}Mn_{0.0498}Zr_{0.0020}Si_{0.0005})B_{0.0005}W_{0.0020}O_2$ |
| Comparative example 1 | $Ni_{0.55}Co_{0.15}Mn_{0.30}(OH)_2$ | $Li(Ni_{0.5489}Co_{0.1497}Mn_{0.2994}Zr_{0.0020})O_2$ | $Li(Ni_{0.5481}Co_{0.1495}Mn_{0.2990}Zr_{0.0020})Al_{0.0015}O_2$ |
| Comparative example 2 | $Ni_{0.55}Co_{0.15}Mn_{0.30}(OH)_2$ | $Li(Ni_{0.5489}Co_{0.1497}Mn_{0.2994}Zr_{0.0020})O_2$ | $Li(Ni_{0.5481}Co_{0.1495}Mn_{0.2990}Zr_{0.0020})Al_{0.0015}O_2$ |
| Comparative example 3 | $Ni_{0.55}Co_{0.15}Mn_{0.30}(OH)_2$ | $Li(Ni_{0.5489}Co_{0.1497}Mn_{0.2994}Zr_{0.0020})O_2$ | $Li(Ni_{0.5481}Co_{0.1495}Mn_{0.2990}Zr_{0.0020})Al_{0.0015}O_2$ |
| Comparative example 4 | $Ni_{0.55}Co_{0.15}Mn_{0.30}(OH)_2$ | $Li(Ni_{0.5489}Co_{0.1497}Mn_{0.2994}Zr_{0.0020})O_2$ | $Li(Ni_{0.5481}Co_{0.1495}Mn_{0.2990}Zr_{0.0020})Al_{0.0015}O_2$ |
| Comparative example 5 | $Ni_{0.55}Co_{0.15}Mn_{0.30}(OH)_2$ | $Li(Ni_{0.5489}Co_{0.1497}Mn_{0.2994}Zr_{0.0020})O_2$ | $Li(Ni_{0.5481}Co_{0.1495}Mn_{0.2990}Zr_{0.0020})Al_{0.0015}O_2$ |
| Comparative example 6 | $Ni_{0.55}Co_{0.15}Mn_{0.30}(OH)_2$ | $Li(Ni_{0.5489}Co_{0.1497}Mn_{0.2994}Zr_{0.0020})O_2$ | $Li(Ni_{0.5481}Co_{0.1495}Mn_{0.2990}Zr_{0.0020})Al_{0.0015}O_2$ |

Test Example 1

The single crystal multi-element cathode materials obtained in the examples and the comparative examples were respectively tested, and the results comprise agglomeration rate B, granularity $D_{10}$, granularity $D_{50}$, granularity $D_{90}$, uniformity $K_{50}$ and roundness R, and are shown in Table 3.

TABLE 3

| Number | Agglomeration rate B | $D_{10}$ | $D_{50}$ | $D_{90}$ | $K_{90}$ | Roundness R | $K_{90}*R$ |
|---|---|---|---|---|---|---|---|
| Unit | % | μm | μm | μm | / | / | / |
| Example 1 | 1.30 | 2.11 | 4.22 | 7.24 | 1.22 | 1.05 | 1.28 |
| Example 2 | 2.40 | 2.01 | 4.16 | 7.03 | 1.21 | 1.09 | 1.32 |
| Example 3 | 0.80 | 2.37 | 4.34 | 7.58 | 1.20 | 1.14 | 1.37 |
| Example 4 | 1.20 | 2.04 | 3.90 | 6.78 | 1.22 | 1.03 | 1.25 |
| Example 5 | 1.30 | 1.93 | 3.60 | 6.41 | 1.24 | 1.06 | 1.32 |
| Comparative example 1 | 1.40 | 2.31 | 4.32 | 7.83 | 1.28 | 1.47 | 1.88 |
| Comparative example 2 | 4.30 | 1.93 | 4.09 | 6.73 | 1.14 | 1.21 | 1.42 |
| Comparative example 3 | 2.10 | 2.01 | 4.22 | 7.38 | 1.27 | 1.54 | 1.96 |
| Comparative example 4 | 1.80 | 1.99 | 4.13 | 7.37 | 1.30 | 1.26 | 1.64 |
| Comparative example 5 | 1.60 | 1.43 | 3.74 | 7.97 | 1.75 | 1.06 | 1.85 |
| Comparative example 6 | 1.70 | 2.22 | 4.55 | 6.78 | 1.00 | 1.09 | 1.09 |

Test Example 2

The single-crystal multi-element cathode materials obtained in the examples and the comparative examples were respectively subjected to tests including grain size $P_{50}$ and compacted density, and electrochemical performance tests, and the results were shown in Table 4.

TABLE 4

| Number Unit | Grain size $P_{50}$ μm | Compacted density g/cm³ | Specific capacity of first discharge 0.1 C mAh/g | Specific capacity of discharge 0.3 C mAh/g | 0.3 C/ 0.1 C % | Capacity retention rate [3] % |
|---|---|---|---|---|---|---|
| Example 1 | 2.2 | 3.27 | 190.4 | 183.4 | 96.3 | 95.2 |
| Example 2 | 1.8 | 3.12 | 191.3 | 183.2 | 95.8 | 94.6 |
| Example 3 | 2.6 | 3.18 | 189.9 | 182.9 | 96.3 | 95.2 |
| Example 4 | 2.2 | 3.24 | 206.5 | 196.8 | 95.3 | 93.5 |
| Example 5 | 2.2 | 3.21 | 212.7 | 201.4 | 94.7 | 93.2 |
| Comparative example 1 | 2.6 | 2.77 | 186.4 | 173.2 | 92.9 | 89.3 |
| Comparative example 2 | 1.8 | 2.63 | 185.9 | 174.1 | 93.7 | 88.4 |
| Comparative example 3 | 2.2 | 2.83 | 186.1 | 172.2 | 92.5 | 88.5 |
| Comparative example 4 | 2.2 | 2.87 | 186.0 | 173.8 | 93.4 | 88.6 |
| Comparative example 5 | 2.2 | 2.99 | 188.1 | 177.6 | 94.4 | 87.9 |
| Comparative example 6 | 2.2 | 2.97 | 187.4 | 176.3 | 94.1 | 88.1 |

Note: the capacity retention rate [3] is the high temperature cycle capacity retention rate.

Figure 2:
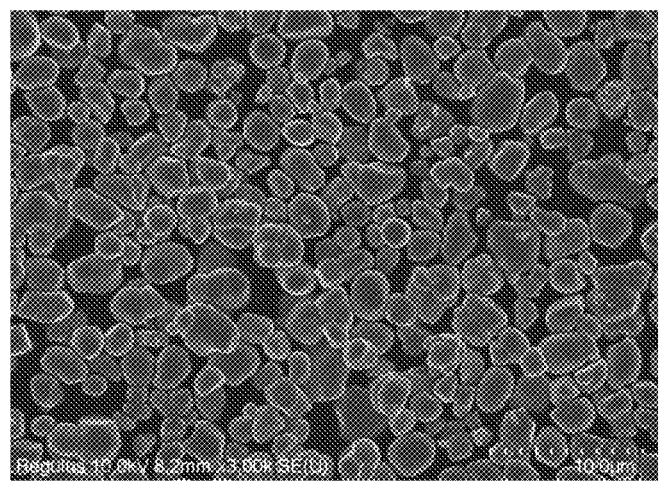
FIG. 2 is an SEM image of a single-crystal multi-element cathode material prepared in example 2 of the present invention.
Figure 3:
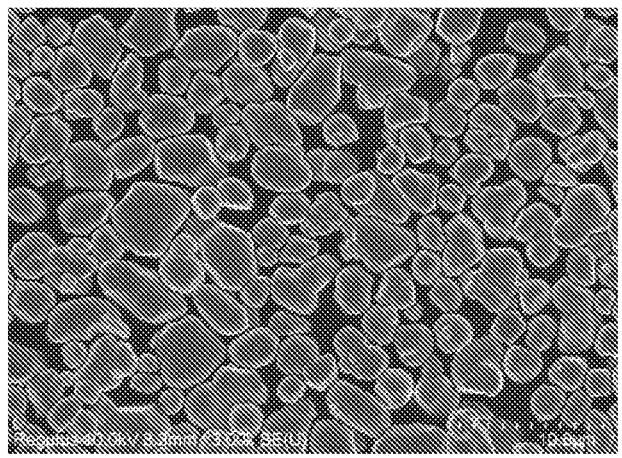
FIG. 3 is an SEM image of a single-crystal multi-element cathode material prepared in example 3 of the present invention.
Figure 4:
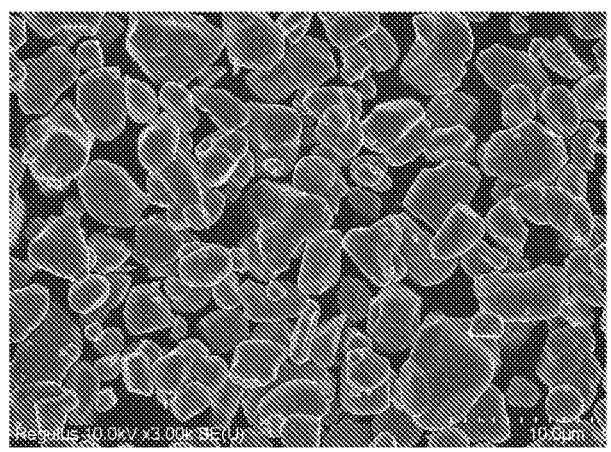
FIG. 4 is an SEM image of a single-crystal multi-element cathode material prepared in comparative example 1 of the present invention.
Figure 5:
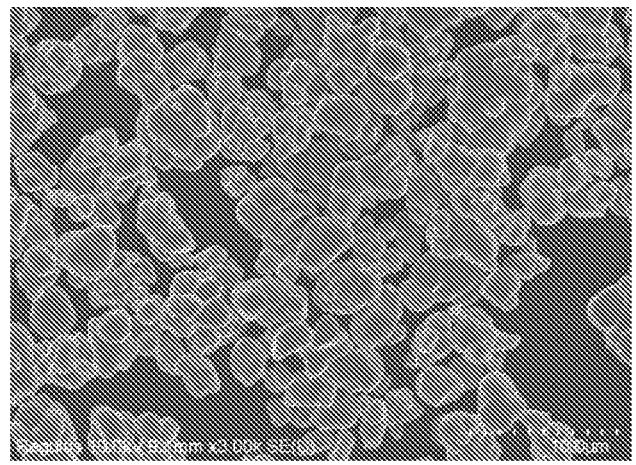
FIG. 5 is an SEM image of a single-crystal multi-element cathode material prepared in comparative example 2 of the present invention.
Figure 6:
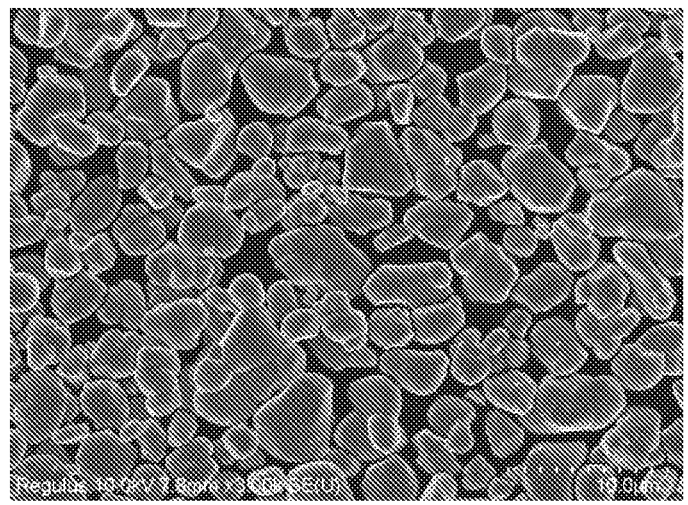
FIG. 6 is an SEM image of a single-crystal multi-element cathode material prepared in comparative example 3 of the present invention.
Figure 7:
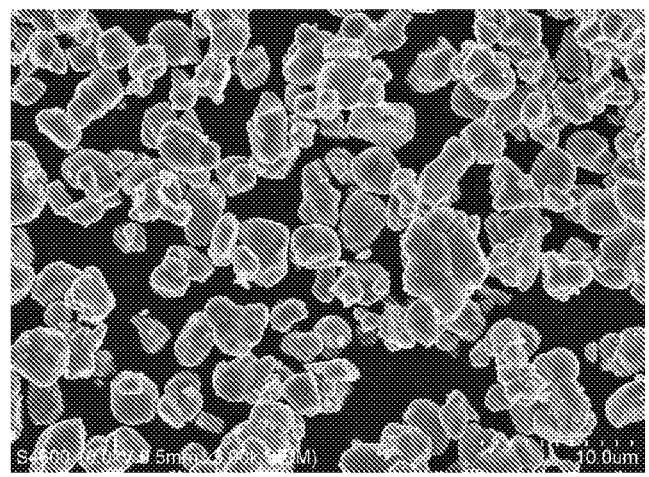
FIG. 7 is an SEM image of a single-crystal multi-element cathode material prepared in comparative example 4 of the present invention.

The present invention exemplarily provides scanning electron microscope (SEM) images of the single-crystal multi-element cathode materials obtained in examples 1 to 3 and comparative examples 1 to 4, which are sequentially shown in FIGS. 1 to 7, respectively. As can be seen from the figures, compared with the single-crystal multi-element cathode materials obtained in examples 2-3 (FIGS. 2 and 3) and comparative examples 1-2 (FIG. 4-5), the single-crystal multi-element cathode material obtained in example 1 of the present invention (FIG. 1) has round and regular single crystal particles and better morphology;

The grain size $P_{50}$ of the single crystal particles of the single crystal multi-element cathode material obtained in example 2 (FIG. 2) and the single crystal multi-element cathode material obtained in comparative example 2 (FIG. 5) is 1.8 μm, and it can be clearly seen from the electron microscope image that part of the particles still maintain the shape of the precursor and the particles are adhered, but compared with the single crystal multi-element cathode material obtained in comparative example 2, the single crystal multi-element cathode material obtained in example 2 of the present invention through the sintering process of oxygen and air in the process of primary sintering has better particle independence and regularity;

The single-crystal multi-element cathode material obtained in example 3 (FIG. 3) and the single-crystal multi-element cathode material obtained in comparative example 1 (FIG. 4) have the crystal grain size $P_{50}$ of 2.6 μm, larger crystal grains, good independence but poor regularity, but the single crystal grains of the single-crystal multi-element cathode material obtained in example 3 of the present invention are more rounded than those of the single-crystal multi-element cathode material obtained in comparative example 1;

The single-crystal multi-element cathode material obtained in example 1 and the single-crystal multi-element cathode materials obtained in comparative examples 3 and 4 all had a crystal grain size $P_{50}$ of 2.2 μm, but the single crystal particles of the single-crystal multi-element cathode material obtained in example 1 of the present invention were superior to the single-crystal multi-element cathode materials obtained in comparative examples 3 and 4 in both the roundness and the degree of independence.

The results show that the single-crystal multi-element cathode material provided by the present invention has more round and regular appearance, and its single crystal particles have uniform size, less aggregation, and less adhesion, which have the characteristics of high compaction density, good rate capability, and excellent cycle performance. Wherein:

Comparing examples 1 to 3 with comparative examples 1 and 2, it can be seen that when the grain size $P_{50}$ of the single crystal particles is 2.0 to 2.4 μm, the overall performance is optimal, the compaction density is highest, the rate and high-temperature cycle retention rate are optimal, and the capacity can be maintained at a higher level; when $P_{50}$ is less than 2.0 μm, the compaction density will be reduced, the rate and the retention rate will be deteriorated, but the lithium ion transmission path in the particles will be shortened and the capacity will be slightly increased after the crystal particles becomes smaller; when $P_{50}$ is more than 2.4 μm, the compaction density is also reduced, and the reduction trend is smaller than that when $P_{50}$ is less than 2.0 μm;

Comparing example 2 with comparative example 2, and example 3 with comparative example 1, it can be seen that under the condition that the whole process of the first sintering is air atmosphere, the crystal growth direction on the surface of the particles after the lithium source is melted starts from the outside, therefore, lower temperature is needed to expand; under the condition that the whole process of the first sintering is oxygen atmosphere, the crystal is more, the crystal grows from the inside of the particle, and higher temperature is needed to increase the crystal. Compared with the compacted density and the electrochemical performance of the single-crystal multi-element cathode material, it can be seen that the single-crystal particles of the single-crystal multi-element cathode material, obtained by the sintering mode of oxygen in the temperature rising stage and air in the constant temperature stage in the first sintering provided by the present invention, have better compacted density and better electrochemical performance;

Comparing example 1 with comparative examples 3 and 4, it can be seen that the single-crystal multi-element cathode material prepared by different processes has different properties even though the single-crystal multi-element cathode material has the same crystal grain size, and the single-crystal multi-element cathode material prepared by the sintering mode of oxygen in the temperature rising stage and air in the constant temperature stage in the first sintering, has obviously better compaction density and electrochemical properties than the multi-element cathode material prepared by adopting single atmosphere;

In addition, the agglomeration rate can influence the cycle performance of the material, and the above table shows that the size of the crystal grain has a direct relation with the agglomeration rate, and the larger the crystal grain size is, the smaller the agglomeration rate is, and the better the cycle performance is relatively; meanwhile, the sintering atmosphere also has certain influence on the agglomeration rate and the cycle performance, under the condition of equivalent grain size, the agglomeration rate of the single crystal particles prepared by the sintering mode of oxygen combined with air in the first sintering of the present invention, is obviously lower than that of particles prepared by the first sintering under single oxygen or air atmosphere (the agglomeration rate under the oxygen atmosphere is lower than that under the air atmosphere), and the cycle performance of the corresponding multi-element cathode material is as follows: oxygen combined with air>oxygen>air. Meanwhile, the roundness index also shows that the single crystal particles of the single crystal multi-element cathode material obtained by the method of the present invention are more round and regular, and the roundness of a single oxygen atmosphere is superior to that of a single air atmosphere under the same grain size;

It can be seen from examples 4 and 5 that the method provided by the present invention is also applicable to high nickel products. Along with the increase of the nickel content and the reduction of the cobalt content, the roundness and the compaction density of the multi-element cathode material can be kept at a higher level, the capacity in the aspect of electrochemical performance can be obviously improved, but the rate capability and the cycle performance can be correspondingly worsened;

From example 1 and comparative examples 5 and 6, it can be seen that under the condition that the degree of roundness of the multi-element cathode material prepared by the same sintering method satisfies the range defined by the present invention, $K_{90}$ is too large or too small, so that the product of $K_{90}$ and R is beyond the range defined by the present invention, and the compaction density, capacity and cycle life of the multi-element cathode material are reduced to different degrees.

The preferred embodiments of the present invention have been described above in detail, but the present invention is not limited thereto. Within the scope of the technical idea of the invention, many simple modifications can be made to the technical solution of the invention, including various technical features being combined in any other suitable way, and these simple modifications and combinations should also be regarded as the disclosure of the invention, and all fall within the scope of the invention.

The invention claimed is:

1. The single-crystal multi-element cathode material, wherein the ratio of the length of the longest diagonal line to the length of the shortest diagonal line, which is measured by SEM, of the single crystal particles of the single-crystal multi-element cathode material is defined as roundness R, and R≥1;

$D_{10}$, $D_{50}$ and $D_{90}$ of the single crystal particles of the single-crystal multi-element cathode material satisfy: $K_{90}=(D_{90}-D_{10})/D_{50}$, and the product of $K_{90}$ and R is 1.20-1.40.

2. The single-crystal multi-element cathode material according to claim 1, wherein R is 1-1.2;

And/or, the product of $K_{90}$ and R is 1.25-1.35;

And/or, $K_{90}$ is 1.18-1.25.

3. The single-crystal multi-element cathode material according to claim 2, wherein $K_{90}$ is 1.20-1.22.

4. The single-crystal multi-element cathode material according to claim 1, wherein the single-crystal multi-element cathode material has a structure represented by formula I:

$$Li_{1+a}(Ni_xCo_yMn_zG_b)M_cO_{2-d} \qquad \text{formula I;}$$

In the formula, −0.05≤a≤0.3, 0≤b≤0.05, 0≤c≤0.05, 0.5≤x<1, 0<y<0.5, 0<z<0.5; d is valued to ensure that the positive and negative charges are equal; G is one or more of Ti, W, V, Ta, Zr, La, Ce, Er, Sr, Si, Al, B, Mg, Co, F and Y; M is one or more of Sr, F, B, Al, Nb, Co, Mn, Mo, W, Si, Mg, Ti and Zr.

5. The single-crystal multi-element cathode material according to claim 4, wherein in the formula, 0≤a≤0.2, 0.0001≤b≤0.005, 0.0001≤c≤0.005, 0.5≤x≤0.95, 0.01≤y≤0.4, 0.01≤z≤0.4;

And/or, G is one or more of Ti, W, Zr, Sr, Si, Al, B and F;

And/or, M is one or more of Sr, F, B, Al, W, Si and Ti.

6. The single-crystal multi-element cathode material according to claim 1, wherein the agglomeration rate of the single-crystal multi-element cathode material is B, and B is 0 to 3.0%.

7. The single-crystal multi-element cathode material according to claim 6, wherein B is 0.8% to 2.4%.

8. The single-crystal multi-element cathode material according to claim 1, wherein the average value of the length of the longest diagonal line and the length of the shortest diagonal line of the single crystal particles of the single-crystal multi-element cathode material is the crystal grain size $P_{50}$, and $P_{50}$ is 1.5 μm to 3.0 μm.

9. The single-crystal multi-element cathode material according to claim 8, wherein $P_{50}$ is 2.0 μm to 2.4 μm.

10. A method for preparing a single-crystal multi-element cathode material according to claim 1, comprising the following steps:

(1) Performing first sintering on a mixture containing a nickel-cobalt-manganese precursor and a lithium source, and crushing an obtained product to obtain a single-crystal cathode material process product;

(2) Performing second sintering on the single-crystal cathode material process product to obtain a single-crystal multi-element cathode material;

The first sintering comprises a temperature rise stage I and a constant temperature stage I which are sequentially carried out, wherein the temperature rise stage I is carried out in an oxygen atmosphere, and the constant temperature stage I is carried out in an air atmosphere;

The temperature of the second sintering is not higher than that of the first sintering.

11. The method according to claim 10, wherein in step (1), the nickel-cobalt-manganese precursor is selected from oxides and/or hydroxides containing nickel, cobalt and manganese;

And/or, the lithium source is selected from lithium carbonate and/or lithium hydroxide;

And/or, the mixed raw material further includes an additive agent selected from at least one of an oxide, a hydroxide, a carbonate and a fluoride containing G.

12. The method according to claim 11, wherein in step (1), the additive agent is selected from at least one of zirconia, strontium carbonate, strontium hydroxide, silica, alumina, aluminum hydroxide, tungsten trioxide, titanium oxide, aluminum fluoride and boron oxide.

13. The method according to claim 10, wherein in step (1), the conditions of the temperature rise stage I further include: the temperature rise time is 2-10 h And/or, the conditions of the constant temperature phase I further include: the constant temperature is 600-1100° C.; the constant temperature time is 6-12 h;

And/or, the median particle size value $D_{50}$ of the nickel-cobalt-manganese precursor and the median particle size value $D'_{50}$ of the single-crystal cathode material process product satisfy formula II:

$$|(D_{50}-D'_{50})/D_{50}|<5\%$$ formula II.

14. The method according to claim 13, wherein in step (1), the conditions of the constant temperature phase I further include: the constant temperature is 900-1000° C.; the constant temperature time is 8-10 h.

15. The method according to claim 10, wherein in the step (2), the single-crystal cathode material process product is mixed with a coating agent, and the resultant mixture is subjected to the second sintering; the coating agent is selected from at least one of an oxide, a hydroxide, a carbonate and a fluoride containing M.

16. The method according to claim 15, wherein in the step (2), the coating agent is selected from at least one of strontium carbonate, strontium hydroxide, silica, alumina, aluminum hydroxide, tungsten trioxide, titanium oxide, aluminum fluoride and boron oxide.

17. The method according to claim 10, wherein in step (2), the second sintering is performed under an air atmosphere;

And/or, the second sintering includes a temperature rise stage II and a constant temperature stage II which are sequentially carried out;

And/or, the conditions of the temperature rise stage II further include: the temperature rise time is 2-10 h;

And/or, the conditions of the constant temperature stage II further include: the constant temperature is 500-900° C.; the constant temperature time is 6-12 h.

18. The method according to claim 17, wherein in step (2), the conditions of the constant temperature stage II further include: the constant temperature is 600-800° C.; the constant temperature time is 8-10 h.

19. The method according to claim 10, wherein ΔP is the grain size change value of the single-crystal multi-element cathode material, in units of μm; ΔT is the temperature change value in the same sintering step, in units of ° C.; Δt is the time change value in the same sintering step, in units of h, and the three satisfy: ΔP=ωΔT+γΔt, wherein ω=0.02 μm/° C., γ=0.1 μm/h.

20. A lithium ion battery, wherein the lithium ion battery contains the single-crystal multi-element cathode material according to claim 1.

* * * * *